(12) United States Patent
Corisis

(10) Patent No.: US 6,772,510 B1
(45) Date of Patent: Aug. 10, 2004

(54) MAPABLE TAPE APPLY FOR LOC AND BOC PACKAGES

(76) Inventor: David J. Corisis, 4903 Stamm La., Nampa, ID (US) 83686

( * ) Notice: Subject to any disclaimer, the term of this patent is extended or adjusted under 35 U.S.C. 154(b) by 107 days.

(21) Appl. No.: 09/643,451

(22) Filed: Aug. 22, 2000

(51) Int. Cl.$^7$ .............................................. H05K 3/30
(52) U.S. Cl. ............................. 29/832; 29/739; 29/740; 29/840; 228/4.5; 228/1.1; 228/110.1; 228/180.5; 156/64
(58) Field of Search ......................... 29/739, 740, 741, 29/840, 832; 228/4.5, 180.5, 1.1, 110.1; 414/222.07, 222.13, 225.01, 226.03, 226.04; 156/64

(56) References Cited

U.S. PATENT DOCUMENTS

| 4,759,675 A | * | 7/1988 | Bond et al. ................... 29/825 |
| 5,286,679 A | | 2/1994 | Farnworth et al. .......... 437/209 |
| 6,509,269 B2 | * | 1/2003 | Sun et al. ................... 438/690 |

* cited by examiner

Primary Examiner—Richard Chang
(74) Attorney, Agent, or Firm—Fletcher Yoder

(57) ABSTRACT

A method and apparatus for attaching an integrated circuit die to a leadframe or substrate. Specifically, a wafer, which is populated with integrated circuit dies, is electrically tested and a wafer map is generated depicting the electrically good dies. An adhesive material is deposited on only the electrically good dies in accordance with the wafer map. The electrically good integrated circuit die may then be attached to a leadframe or substrate.

10 Claims, 5 Drawing Sheets

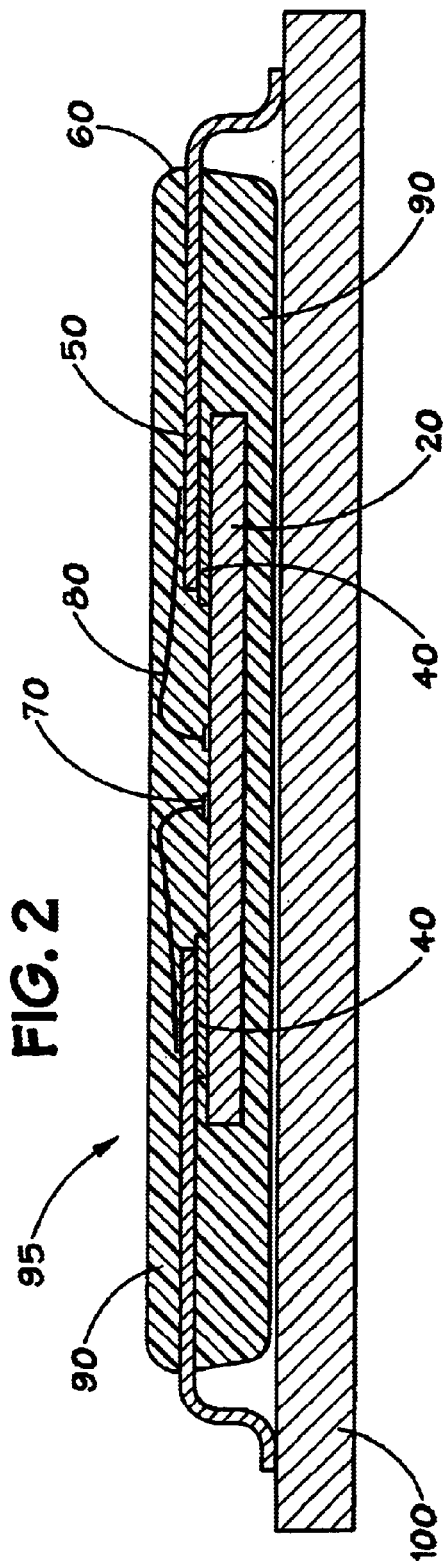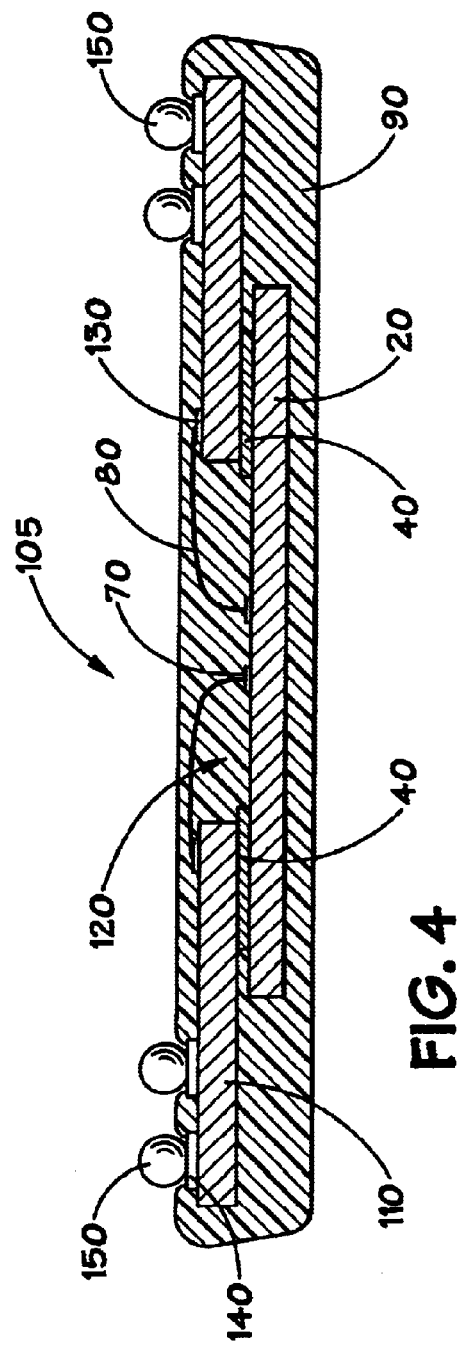

MAPABLE TAPE APPLY FOR LOC AND BOC PACKAGES

BACKGROUND OF THE INVENTION

1. Field of the Invention

The present invention relates generally to integrated circuit packaging and, more particularly, to a method and apparatus for attaching an integrated circuit die to a leadframe or substrate.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The packaging of electrical circuits is a key element in the technological development of any device containing electrical components. A single integrated circuit die is typically encapsulated within a sealed package to be mounted on a printed circuit board (PCB) or a similar apparatus for incorporation into a system. The integrated circuit die is generally encapsulated within a molding compound to protect the die from external contamination or physical damage. Because the integrated circuit die is generally encapsulated, the encapsulated integrated circuit package also provides a system of interconnects for electrically coupling the integrated circuit die to a (PCB) or other external circuitry.

Two common surface mount techniques include using lead-on-chip (LOC) and board-on-chip (BOC) packaging. For LOC packages, an integrated circuit die is typically attached to a leadframe. A leadframe is a metal frame comprised of a plurality of lead fingers. The integrated circuit die is physically attached to the lead fingers by an adhesive, such as tape or epoxy, and electrically coupled to the lead fingers by bond wires. Prior to the encapsulation process, the die is typically mounted to the lower surfaces of the lead fingers. The lead fingers are electrically coupled to the integrated circuit die by bond wires which extend from the lead finger to pads along the center of the integrated circuit die. The leadframe package is then encapsulated such that the lead fingers extending from the integrated circuit die protrude from the edges of the molding compound used to encapsulate the module. A molded package is then excised from the leadframe resulting in an encapsulated integrated circuit die with lead fingers extending outside of the molding compound to electrically couple the integrated circuit die to a PCB or other electrical device.

For BOC packages, the integrated circuit die is attached to a substrate. The integrated circuit die is mounted on the substrate "face-down." In this instance, the substrate contains a slot. Since the integrated circuit die is mounted face-down, the bond pads on the surface of the integrated circuit die are arranged to correlate with the slot opening in the substrate. Bond wires are attached from the bond pads on the integrated circuit die to the backside of the substrate. The substrate contains conductive traces to distribute electrical signals to pads along the backside of the substrate which will eventually be attached to a PCB or other external device.

Alternately, the integrated circuit die may be attached to the substrate "face-up". That is to say that the side of the integrated circuit die containing the bond pads for wire bonding the integrated circuit die to the substrate is left exposed on the top surface. This is known as chip-on-board or COB packaging. The backside of the integrated circuit die, i.e., the side not containing the bond pads, is adhered to the substrate. In a COB package, bond wires are attached from the surface of the integrated circuit die down to pads on the surface of the substrate. The substrate contains conductive traces which route signals from the top side of the substrate to the backside of the substrate.

Regardless of whether the integrated circuit die is mounted to the substrate face-up (COB) or face-down (BOC), either the die or the substrate is generally disposed with an adhesive, such as tape or epoxy, in order to attach the die to the substrate. Finally, the entire package is generally encapsulated in a molding compound. Various techniques such as pin grid array (PGA) or ball grid array (BGA), may be incorporated to provide a means of connecting the integrated circuit package to the PCB or other external device.

Furthermore, regardless of whether LOC or BOC/COB packaging technology is incorporated, a key component in the packaging process is the attachment of the integrated circuit die to the leadframe (LOC) or substrate (BOC/COB). One method of attaching the integrated circuit die to the leadframe or substrate is to attach an adhesive directly to the lead fingers or the substrate. However, this method may be an expensive and complicated process. Another means of attaching the integrated circuit die to the leadframe or the substrate is to apply tape or to screen print the entire wafer with an adhesive epoxy before the integrated circuit dies are singulated and attached to the leadframe or substrate. However, this method will result in a waste of material since all of the integrated circuit dies, including those which may be electrically faulty, are covered with the adhesive or tape. Since the faulty dies will be discarded, this method disadvantageously wastes the adhesive material. What is needed is a simple method for attaching the integrated circuit die to a leadframe or substrate which may be easily implemented in current manufacturing systems and which mitigates the waste of production material.

According to the current process, the tape decal or adhesive is applied to the leadframe or substrate first, either in-house or at the leadframe or substrate supplier. Next, the integrated circuit chip is attached to the tape on the frame or the substrate. One problem with this method is that most integrated circuit chip assemblers do not have the capability to apply tape decals or adhesive to an LOC leadframe or BOC/COB substrate. Therefore, the tape or adhesive is generally attached by the supplier of the leadframe or substrate. This lack of ability increases the leadframe and unit costs.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a method for attaching an integrated circuit die to a leadframe, comprising the steps of: fabricating a plurality of Integrated circuit die on a wafer; testing the integrated circuit die on the wafer to determine electrically good integrated circuit die; providing a wafer map depicting the electrically good integrated circuit die; disposing an adhesive material onto the electrically good circuit die in accordance with the wafer map; singulating the integrated circuit die; adhering the good integrated circuit die to a leadframe; electrically coupling the good integrated circuit die to a plurality of fingers on the leadframe to form an integrated circuit package; and excising the integrated circuit package from the leadframe.

In accordance with another aspect of the present invention, there is provided a method of attaching an integrated circuit die to a substrate comprising: fabricating a plurality of integrated circuit die on a wafer; testing the integrated circuit die on the wafer to determine electrically good integrated circuit die; producing a wafer map depicting the electrically good integrated circuit die; grinding the wafer to a desired thickness; disposing an adhesive material onto the electrically good integrated circuit die in accordance with the wafer map; singulating the integrated circuit die; adhering the good integrated circuit die to a substrate; and electrically coupling the good integrated circuit die to a plurality of bonding pads on the substrate to form an integrated circuit package.

In accordance with still another aspect of the present invention, there is provided a method for disposing an adhesive material onto an integrated circuit die comprising: fabricating a plurality of integrated circuit die on a wafer; testing the integrated circuit die on the wafer to determine electrically good integrated circuit die; producing a wafer map depicting the electrically good integrated circuit die; and disposing an adhesive material onto the electrically good integrated circuit die in accordance with the wafer map.

In accordance with still another aspect of the present invention, there is provided a wafer having an adhesive material disposed on only the electrically good integrated circuit die.

One advantage of the present invention is that it can be easily implemented in-house where the integrated circuit chip assembly takes place. It can easily be incorporated into the present assembly process. Further, by using the wafer map from probe and only applying tape or adhesive to the electrically good die, the amount of wasted tape or adhesive is reduced. Advantageously, this will cut down on overall component cost.

DESCRIPTION OF THE DRAWINGS

The foregoing and other advantages of the invention will become apparent upon reading the following detailed description and upon reference to the drawings in which:

FIG. 2 illustrates a cross-section of the exemplary embodiment of a LOC package taken along line 2—2;

FIG. 4 illustrates a cross-section of the BOC package taken along line 4—4;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
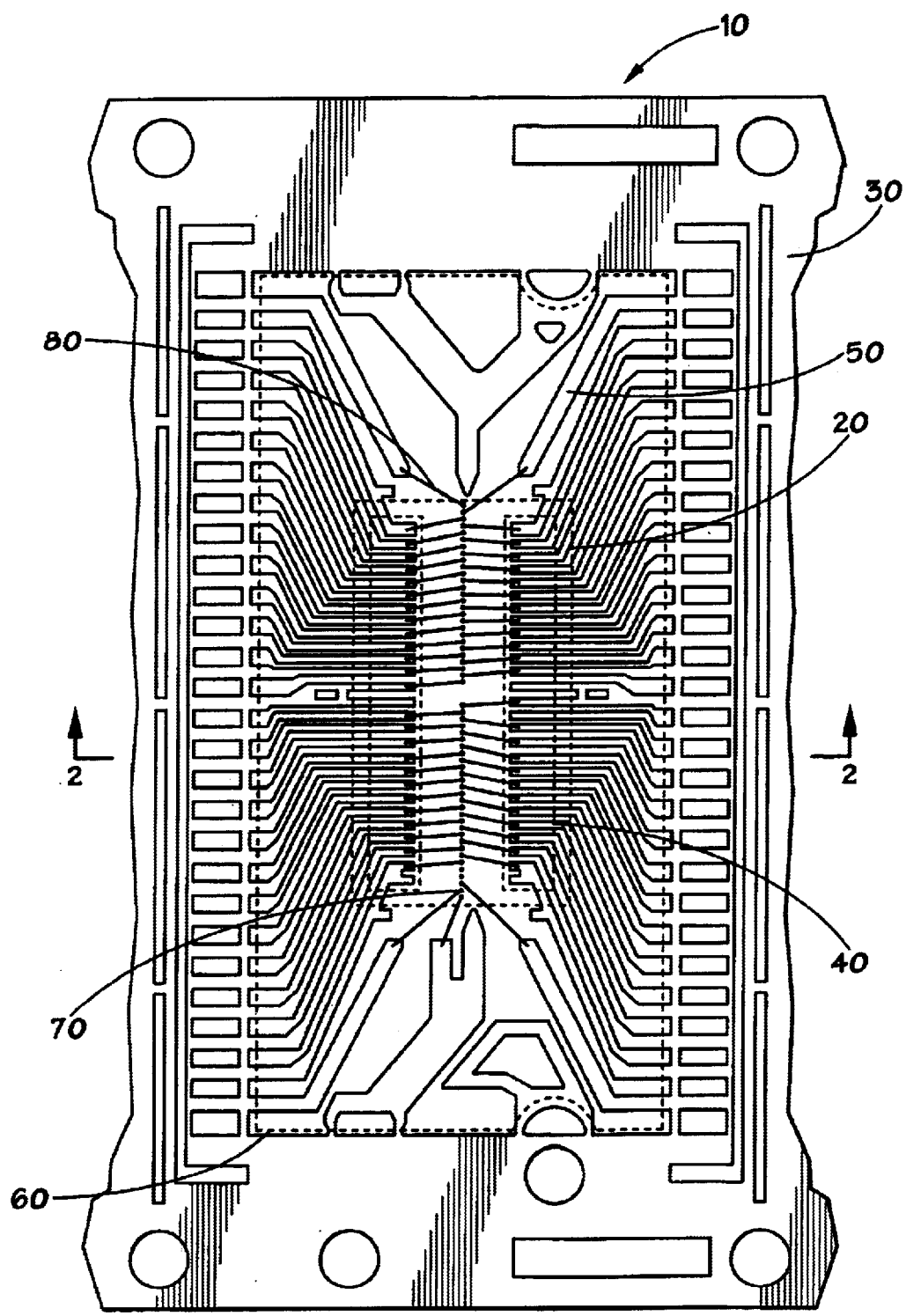
FIG. 1 illustrates a top view of an exemplary embodiment of a LOC package.

Turning now to the drawings, FIG. 1 illustrates an exemplary embodiment of an LOC package generally designated as reference numeral 10. The integrated circuit die 20 is attached to the leadframe 30 by tape strips 40. Alternately, the integrated circuit die 20 may be attached to the leadframe 30 using an adhesive paste. In this illustration, the tape strips 40 are first coupled to the integrated circuit die 20 and then pressed onto the leadframe 30. As previously discussed, the tape strips 40 (or paste) alternatively may be attached to the leadframe 30 first. The leadframe 30 includes a plurality of lead fingers 50. The lead fingers 50 are comprised of a conductive metal and are routed from the inside of the leadframe 30 to a region beyond the package border 60. The package border 60 demarcates the outer border of the molding compound once the package has been encapsulated.

The integrated circuit die 20 includes a plurality of bonding pads 70 which are located on the backside of the integrated circuit die 20. The tape 40 is also attached to the backside of integrated circuit die 20. The bonding pads 70 are used to electrically couple the integrated circuit die 20 to the lead fingers 50 to route signals from the integrated circuit die 20 to the lead fingers 50. Bonding pads 70 are attached to the lead fingers 50 by a plurality of bond wires 80.

FIG. 2 illustrates a cross-section taken along line 2—2 of the LOC package illustrated in FIG. 1, after the encapsulation process has taken place and the integrated circuit package 95 has been excised from the leadframe. The integrated circuit die 20 is attached to the lead fingers 50 by the tape strips 40. The integrated circuit die 20 is electrically coupled to the lead fingers 50 by bond wires 80 which extend from bonding pads 70 located on the integrated circuit die 20 to the lead fingers 50. In this illustration, the encapsulation process has already taken place. Thus, molding compound 90 completely surrounds the integrated circuit package 95 to provide protection from environmental and physical damage. The lead fingers 50 extend beyond the package border 60 to provide a means of routing the electrical signals from the integrated circuit die 20 outside of the package. The lead fingers 50 may then be attached to a PCB 100 or other electrical device.

Figure 3:
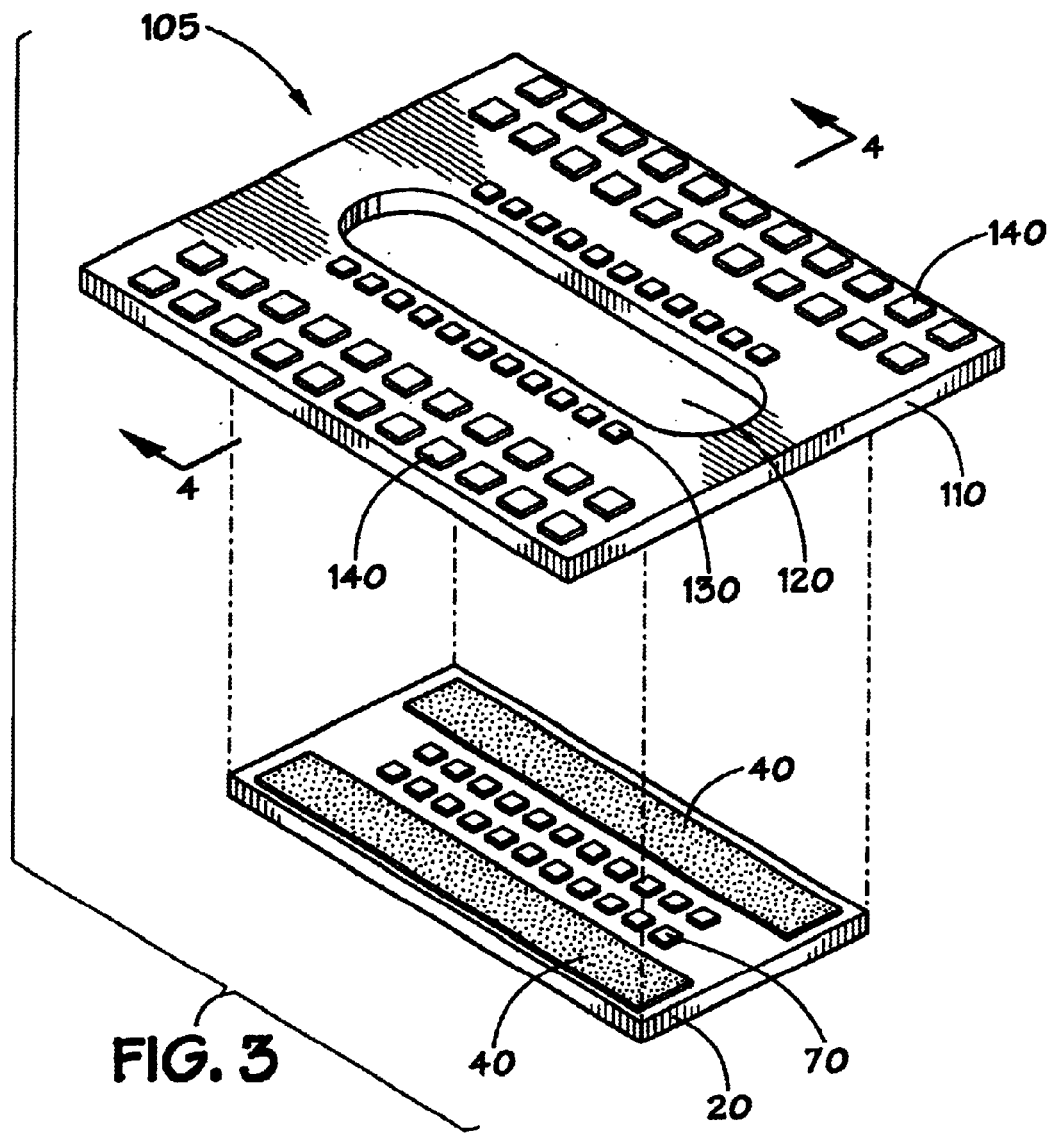
FIG. 3 illustrates an exploded perspective view of a BOC package.

FIG. 3 illustrates an exploded perspective view of a BOC package 105. For the sake of clarity, elements similar to the elements previously described will be designated by like reference numerals. Here, the integrated circuit die 20 is coupled to the substrate 110 by tape strips 40 or an adhesive paste. The integrated circuit die 20 includes a plurality of bonding pads 70. The bonding pads 70 are configured to align with a slot 120 in the substrate 110. Once the integrated circuit die 20 is attached to the substrate 110, the bonding pads 70 on the integrated circuit die 20 will be exposed from the backside of the substrate 110 through the slot 120. Bond wires (not shown) may then be used to electrically couple the integrated circuit die 20 to the substrate 110 by using bond wires to connect bonding pads 70 on the integrated circuit die 20 to bonding pads 130 on the substrate 110. The bonding pads 130 are electrically coupled to ball pads 140 by conductive traces contained within the substrate 110. The ball pads 140 are used to route the electrical signals from the integrated circuit die 20 through the substrate 110 and outside the package 105 once it has been encapsulated. The ball pads 140 may be configured to receive solder balls as in BGA surface mount techniques. Alternately, ball pads 140 may be replaced with pins if PGA surface mount technology is being implemented.

FIG. 4 illustrates a cross-section of the BOC package 105 taken along line 4—4 after the encapsulation process has taken place. The integrated circuit die 20 is attached to the substrate 110 by tape strips 40 or an adhesive epoxy. The integrated circuit die 20 is electrically coupled to the substrate 110 by bond wires 80. The bond wires 80 are coupled to a plurality of bonding pads 70 located on the integrated circuit die 20 and to bonding pads 130 located on the substrate 110. The package 105 is encapsulated with a molding compound 90 which may completely encompass the integrated circuit die 20 and the substrate 110. Ball pads 140 located on the backside of the substrate 110 are used to route the electrical signals to the outside of the package 105. Bonding pads 130 are electrically coupled to the ball pads 140 by conductive traces (not shown) contained within the substrate 110. Solder balls 150 may then be disposed on the ball pads 140 if BGA surface mount technology is implemented. The package may then be attached to a PCB or other external circuitry by means of the solder balls 150.

Figure 5:
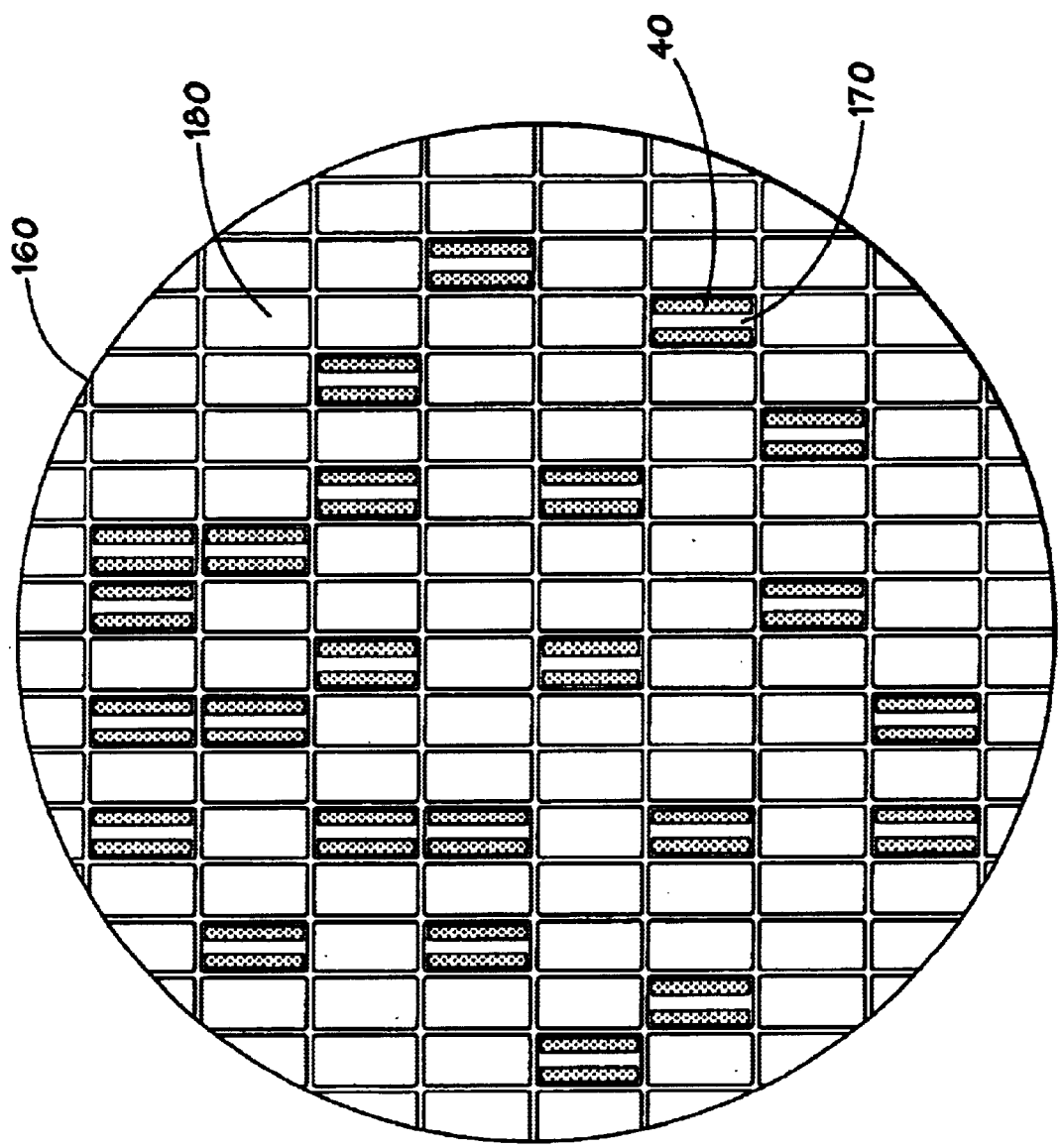
FIG. 5 illustrates a integrated circuit wafer with tape attached to known good die in accordance with the present invention.

FIG. 5 illustrates an integrated circuit wafer 160. The integrated circuit wafer 160 is comprised of a plurality of integrated circuit die. Before the integrated circuit wafer 160 is singulated into separate integrated circuit die, electrical tests are performed to determine which integrated circuit die are electrically good and which are electrically faulty. Once the semiconductor wafer 160 has been electrically tested, a wafer map indicating the locations of electrically good integrated circuit die 170 is produced. The wafer map may be used to dispose adhesive, such as tape strips 40, on only those integrated circuit die which are electrically good. The electrically faulty integrated circuit die 180 are not disposed with the adhesive. Thus, there is no waste of adhesive on the electrically faulty integrated circuit die 180 which will be scrapped once all the dies are singulated.

Figure 6:
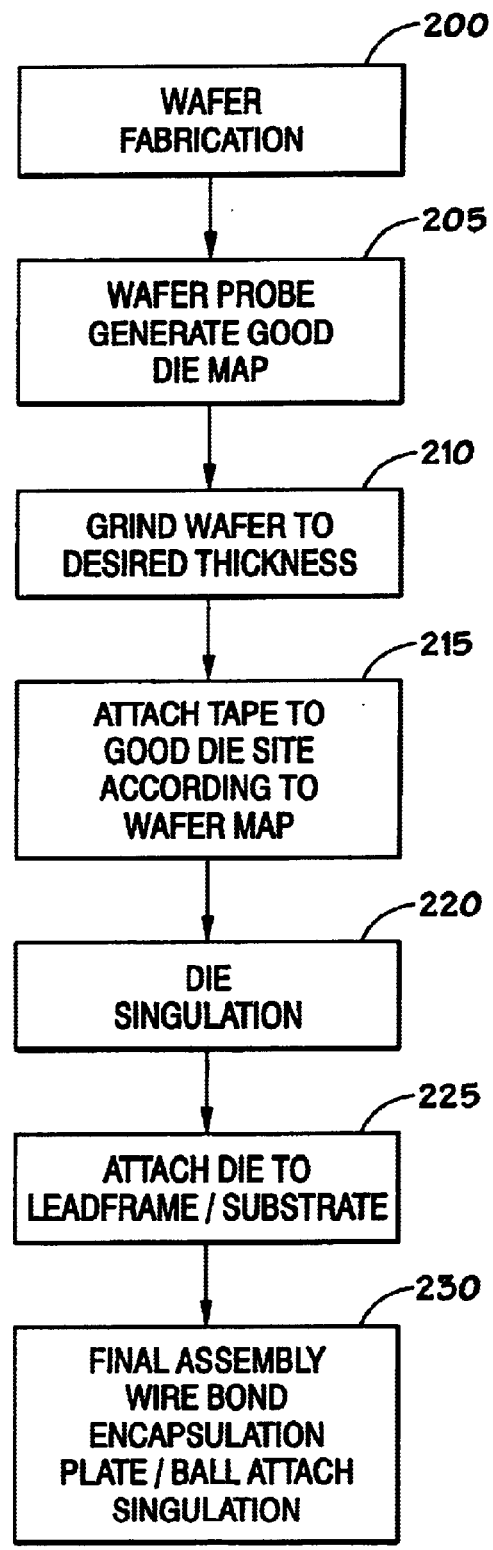
FIG. 6 illustrates a process for providing an integrated circuit package in accordance with the present invention.

FIG. 6 illustrates a method of attaching an integrated circuit die to a substrate or leadframe according to the present invention. The process begins with fabricating the integrated circuit wafer (block 200). Next, the wafer is probed to determine which integrated circuit die are electrically good, and a wafer map indicating which integrated circuit die are electrically good is generated (block 205). Next, the integrated circuit wafer is ground to a desired thickness (block 210). Next, the wafer map is used so that tape or adhesive epoxy is only attached to the electrically good die on the integrated circuit wafer (block 215). Once the tape or adhesive epoxy has been disposed onto the electrically good integrated circuit die, the die are singulated (block 220), and attached to the leadframe or substrate (block 225). The last step in the process is final assembly which generally includes operations such as wire bond, encapsulation, and ball attach and singulation (block 230).

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for attaching an integrated circuit die to a leadframe, comprising the acts of:
    (a) fabricating a plurality of integrated circuit die on a wafer;
    (b) testing the integrated circuit die on the wafer to determine electrically good integrated circuit die;
    (c) producing a wafer map depicting the electrically good integrated circuit die;
    (d) disposing an adhesive material onto only the electrically good integrated circuit die in accordance with the wafer map;
    (e) singulating the integrated circuit die;
    (f) adhering the electrically good integrated circuit die to a leadframe;
    (g) electrically coupling the good integrated circuit die to a plurality of fingers on the leadframe to form an integrated circuit package; and
    (h) excising the integrated circuit package from the leadframe.

2. The method, as set forth in claim 1, comprising encapsulating the integrated circuit package in a molding compound.

3. The method, as set forth in claim 1, comprising grinding the wafer to a desired thickness.

4. The method, as set forth in claim 1, wherein act (d) comprises the act of disposing an adhesive tape onto the electrically good integrated circuit die in accordance with the wafer map.

5. The method, as set forth in claim 1, wherein act (d) comprises the act of disposing an adhesive paste onto the electrically good integrated circuit die in accordance with the wafer map.

6. The method, as set forth in claim 1, wherein (g) comprises attaching a plurality of wire-bonds between a plurality of bonding pads on the integrated circuit die to a plurality of fingers on the leadframe to form an integrated circuit package.

7. The method, as set forth in claim 1, wherein the acts are performed in the recited order.

8. A method for building an integrated circuit package, comprising the acts of:
    (a) fabricating a plurality of integrated circuit die on a wafer;
    (b) testing the integrated circuit die on the wafer to determine electrically good integrated circuit die;
    (c) producing a wafer map depicting the electrically good integrated circuit die;
    (d) disposing an adhesive material onto only the electrically good integrated circuit die in accordance with the wafer map;
    (e) singulating the integrated circuit die;
    (f) adhering the electrically good integrated circuit die to one of a substrate and a leadframe; and
    (g) electrically coupling the good integrated circuit die to one of a plurality of bonding pads on the substrate and a plurality of leads on the leadframe to form an integrated circuit package.

9. The method, as set forth in claim 8, comprising encapsulating the integrated circuit package in a molding compound.

10. The method, as set forth in claim 8, comprising grinding the wafer to a desired thickness.

* * * * *